United States Patent [19]

Stewart

[11] 3,999,205
[45] Dec. 21, 1976

[54] RECTIFIER STRUCTURE FOR A SEMICONDUCTOR INTEGRATED CIRCUIT DEVICE

[75] Inventor: Roger Green Stewart, Neshanic Station, N.J.

[73] Assignee: RCA Corporation, New York, N.Y.

[22] Filed: Apr. 3, 1975

[21] Appl. No.: 564,910

[52] U.S. Cl. .................................. 357/13; 357/40; 357/42; 357/44; 357/45; 307/202 R; 307/285
[51] Int. Cl.² ................. H01L 29/90; H01L 27/02; H01L 27/10; H01L 27/15
[58] Field of Search ............. 357/13, 42, 44, 45, 357/40; 307/202, 285

[56] References Cited

UNITED STATES PATENTS

| | | | |
|---|---|---|---|
| 3,470,390 | 9/1969 | Lin | 357/13 |
| 3,607,465 | 9/1971 | Frouin | 357/13 |
| 3,667,009 | 5/1972 | Rugg | 357/13 |
| 3,677,838 | 7/1972 | De Drebisson | 357/13 |
| 3,882,529 | 5/1975 | Warner | 357/13 |

FOREIGN PATENTS OR APPLICATIONS

1,176,088   1/1970   United Kingdom ................. 357/13

OTHER PUBLICATIONS

Electronics, Gate Protection Diode p. 42, Apr. 26, 1971.

*Primary Examiner*—Andrew J. James
*Attorney, Agent, or Firm*—H. Christoffersen; R. P. Williams

[57] ABSTRACT

A rectifier structure which can be compatibly fabricated in a zone of one type conductivity in a monolithic semiconductor device includes side-by-side surface adjacent regions of mutually opposite type conductivity within and surrounded by a region of conductivity type opposite to that of the zone. A plurality of the rectifier structures may be connected in series. The regions making up the rectifiers may have the same depth and doping profile as regions making up CMOS transistors in the device.

7 Claims, 4 Drawing Figures

RECTIFIER STRUCTURE FOR A SEMICONDUCTOR INTEGRATED CIRCUIT DEVICE

This invention was made in the course of or under a contract with the Department of the Army.

This invention relates to monolithic integrated circuit devices.

One known form of integrated circuit device, known as a CMOS device, includes a plurality of P channel and N channel MOS transistors. In one form, the device is made in a body of semiconductive material of N type conductivity and P channel transistors are formed directly in this material. A well region of P type conductivity is included, and N channel devices are formed in the P well. Isolation between N channel and P channel devices is provided by the PN junction between the P well and the body, which may reverse biased during operation of the device. For this purpose, the body is ordinarily connected to the point of highest potential in the circuit and the P well is connected to the point of lowest potential.

In integrated circuit devices of this type, active elements other than the MOS transistors have been included. For example, resistors and rectifiers have been included to perform other circuit functions such as current and voltage limiting. For example, the gate insulators in known devices are sensitive to high voltage transient signals and are subject to destructive breakdown when high voltage transients are applied. Elements designed to prevent the application of excessive voltages have been connected to the gates to protect them.

In one known form, the protective elements have included a rectifier connected across a gate insulator to be protected in such a way that the maximum voltage which can be impressed across the gate insulator is limited to the reverse breakdown voltage of the rectifier. In CMOS devices, rectifiers have been connected between the gates to be protected and each of the points of highest and lowest available potential in such a way that one or the other will be forward biased if the input voltage exceeds the value of the highest or lowest potential, thus limiting the applied voltage to substantially the range between those values. Desirable characteristics of protective rectifiers of this kind are low forward dynamic resistance and low reverse dynamic resistance. A PN junction having these characteristics can be made by providing adjacent regions of mutually opposite type conductivity of relatively high doping concentration. In CMOS devices, regions have doping profiles corresponding to those of the source and drain regions of the transistors may be used. This serves the additional purpose of minimizing the number of separate processing steps required to making a given device, as is the general practice in the art. A rectifier made by adjacent source and drain type diffusions however would often have a reverse breakdown strength less than the operating voltages of the device. Rectifying means with higher breakdown strengths are therefore required.

One way to provide increased breakdown strength is to connect a plurality of rectifiers in series. MOS integrated circuits are known in which series strings of rectifiers are used. In one known device, a high conductivity region of N+ type conductivity is formed within and surrounded by a high conductivity P+ region. Each of these regions may correspond in doping profile to the sources and drains of transistors formed in the device. This structure is effective for its purpose but has the disadvantage that it is not suitable for use with alloyed aluminum contacts to the N+ and P+ type regions, because the N+ region is necessarily very thin and shorts due to spiking of the alloyed aluminum contacts through the N+ region are difficult to avoid. A need exists, therefore, for a structure which can provide all the desirable characteristics outlined above and can also be made with economic yields.

In the drawings:

FIG. 4 also shows in schematic form the manner in which the CMOS elements may be connected to the rectifiers of the other figures.

Figure 1:
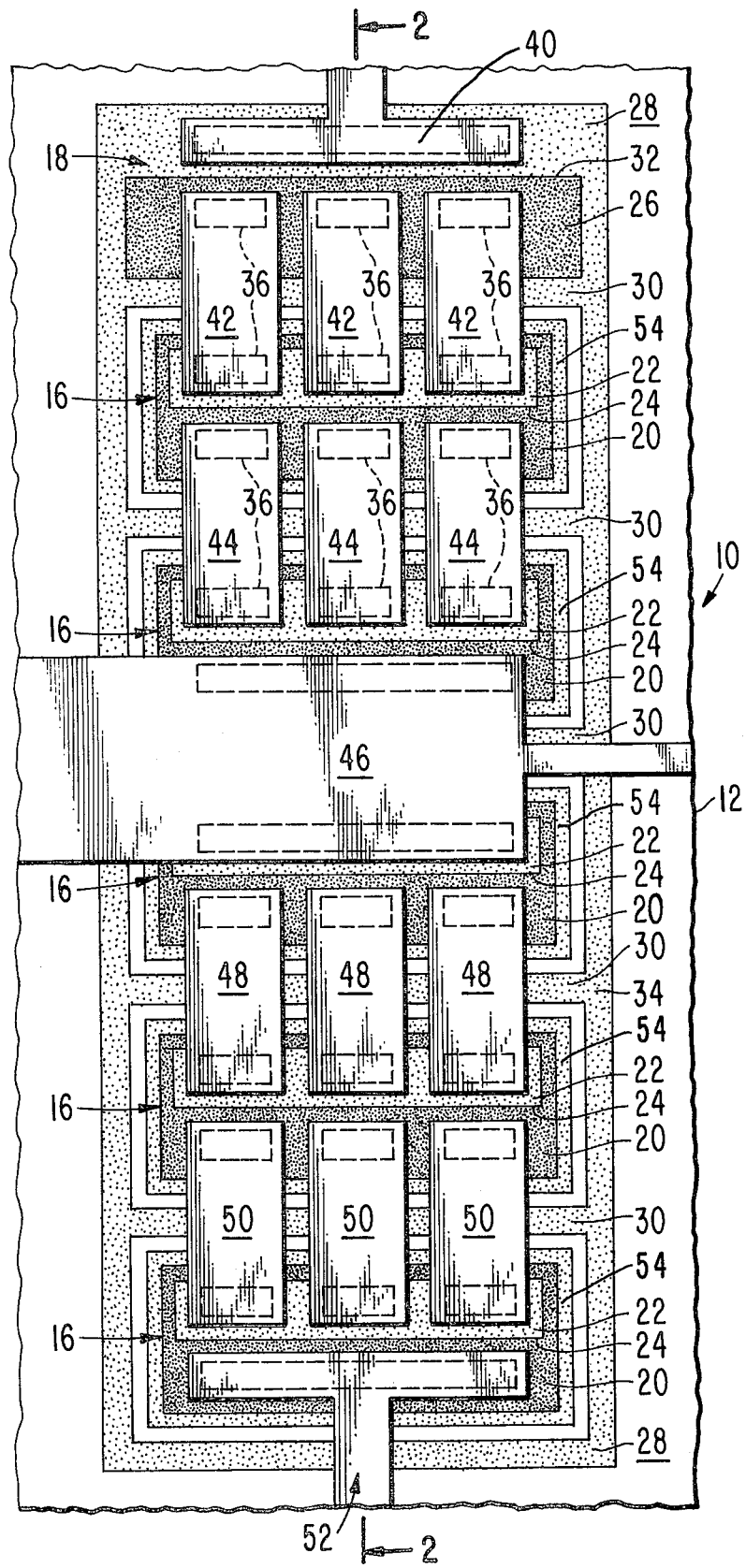
FIG. 1 is a partial plan view of one portion of an integrated circuit device including a plurality of rectifiers.

Two exemplary portions of a monolithic integrated circuit device 10 which incorporates the present novel structure are shown in the drawings. The integrated circuit device 10 is formed in a monolithic body 12 of semiconductive material such as silicon which has a surface 14 (FIGS. 2 and 4) adjacent to which the active and passive elements of the circuit are disposed.

Figure 2:
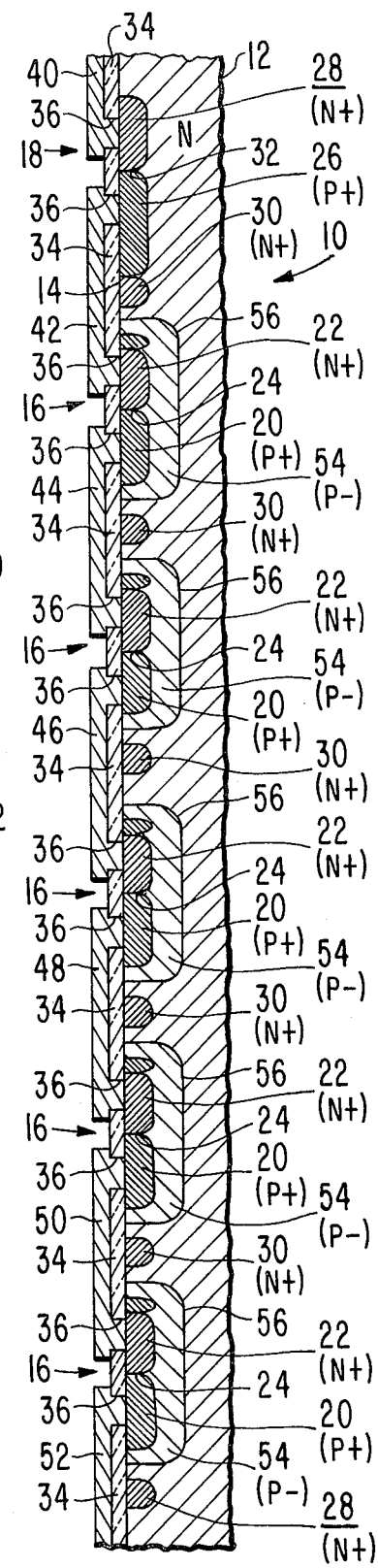
FIG. 2 is a cross section taken along the lines 2—2 of FIG. 1.

In the example illustrated, one portion of the present novel device 10, shown in FIGS. 1 and 2, i.e. one zone of the body 12, includes a series string of six rectifiers. Five of the rectifiers are similarly structured and designated by the numeral 16. The sixth rectifier, 18, has a somewhat different structure. There may be any number of rectifiers depending on the operating voltages of the device and the breakdown conditions of the PN junctions in the device as will be explained below.

Each of the rectifiers 16 includes a pair of side-by-side regions 20 and 22 of mutually opposite type conductivity. In the present example which is adapted to be made compatibly with the processing used to make CMOS devices, the regions 20 and 22 are relatively highly doped because they are formed under the same conditions as the source and drain regions of transistors elsewhere in the device. The pairs of regions 20 and 22 are in side-by-side relation adjacent to the surface 14 and abut each other so as to form a PN junction 24 therebetween. Owing to the relatively high doping concentration in each of the regions 20 and 22, the breakdown voltage of the PN junctions 24 wil be relatively low and the rectifiers 16 may be considered to be zener diodes.

The rectifier 18 is different from the rectifiers 16 in that it has a P+ type region 26 and an N+ type region 28 in side-by-side relationship, where the N+ type region 28 differs from the N+ type regions 22 in that it serves the additional function of acting as a channel stopper in surrounding relation with the other rectifiers 16. For this purpose, the region 28 has a framelike configuration surrounding all the rectifiers 16 and 18, with a crossbar 30 extending between each two rectifiers. The region 26 and the region 28 of the rectifier 18 are in side-by-side relationship with each other and define between them a PN junction 32 having breakdown characteristics similar to those of the PN junctions 24.

The various regions 20 and 22 and 26 and 28 are described here as in side-by-side relationship. This means that the two regions are formed in the body 12 adjacent to separate but contiguous areas of the surface 14. The regions 20 may surround the regions 22 as shown, but the side-by-side relationship distinguishes the present structure from a structure in which one region is formed within the other as by diffusing one region through an area of the device through which the other region is also diffused.

The illustrated structure in which the region 20 surrounds the regions 22 provides a relatively large PN junction area between the regions without sacrificing a substantial amount of area on the surface 14 of the body 12. As shown, each P+ type region 20 is a rectangular region with a smaller rectangular aperture therein. The various N+ type regions 22 are within the apertures in the regions 20 and the relative length of each of the PN junctions 24 will be the entire peripheral length of the respective N+ type region 22. In the rectifier 18, the P+ type region 26 does not surround the N+ type region 28 in this example, because of the dual function of the N+ type region 28. Consequently, the N+ type region 28 may surround the P+ type region 26 in the rectifier 18 similarly providing a relatively large area for the PN junction 36.

Means are provided for connecting the several rectifiers 16 and 18 together, in series in this example. For this purpose, the device 10 has on the surface 14 thereof a conventional insulating and passivating layer 34. See FIG. 2. The insulating layer 34 is provided with apertures 36 wherever contact to the semiconductive material of the body 12 is desired. Conductors are disposed on the insulating layer 34 and have portions extending into the apertures 36 to contact the various regions 20, 22, 26, and 28. For example there is a conductor 40 extending into contact with the N+ type region 28. The P+ type region 26 of the rectifier 18 is connected to the N+ type region 22 of the first adjacent rectifier 16 by a plurality of conductors 42, as shown best in FIG. 1. In this example, there are three of these conductors 42. The plurality of conductors serve to spread any current flowing in either the PN junction 32 of the rectifier 18 or the PN junction 24 of the first adjacent rectifier 16 more uniformly along the length of each junction. The material of the regions 22 and 26 between the contact openings 36 can act as ballasting resistors which tend to prevent current hogging in any given area of the junctions, particularly during any reverse breakdown of the junctions which might occur during operation.

Similar conductors 44 join the P+ type region 20 of the first rectifier 16 to the N+ type region 22 of the next adjacent or second rectifier 16. In this example, where the entire rectifier assembly shown in FIGS. 1 and 2 will serve as a protective means of a CMOS device, the P+ type region 20 of the second rectifier 16 is connected to the N+ type region 22 of the next or third rectifier 16 by a single conductor 46, which may be an input signal conductor for other elements of the CMOS device.

The structure is much the same in the lower half of FIG. 1. For example, a plurality of conductors 48 serve to connect the P+ type region 20 of the third rectifier 16 to the N+ type region 22 of the fourth rectifier 16. Another plurality of conductors 50 serves to connect the P+ type region 20 of the fourth rectifier 16 with the N+ type region 22 of the fifth rectifier 16. Finally, a conductor 52 is connected to the P+ type region 20 of the fifth rectifier 16.

The rectifiers 16 and the rectifier 18 are formed in one common zone of the body 12 of one type and degree of conductivity. Consequently, some means of isolating the rectifiers from each other is required. In the present example, the rectifiers 16 are each disposed within and surrounded by a region 54 of a conductivity type opposite to that of the body 12. Each of the P type regions 54 will assume a potential substantially equivalent to that of the P+ type region 20 which is disposed therein and will form, with the material of the body 12, a PN junction 56 which is reversed biased in normal operation. This reverse bias will be sufficient in normal operation to isolate the rectifiers from each other. No region 54 need be provided in surrounding relation to the rectifier 18 to isolate it from the other rectifiers, since each of the other rectifiers has a PN junction surrounding it.

Since the doping concentration in the regions 54 is relatively low and since metal connections overly this material, in insulated, field applying relation, it is possible that the surface adjacent zones of the regions 54 can be inverted to N type during operation of the device. The surrounding relation of the P+ regions 20 around the N+ regions 22 in the illustrated structure thus has the further advantage of isolating the surrounded N+ regions 22 from an inversion layer in the adjacent regions 54 because of the higher inversion threshold inherent in the P+ material of the regions 20.

Figure 3:
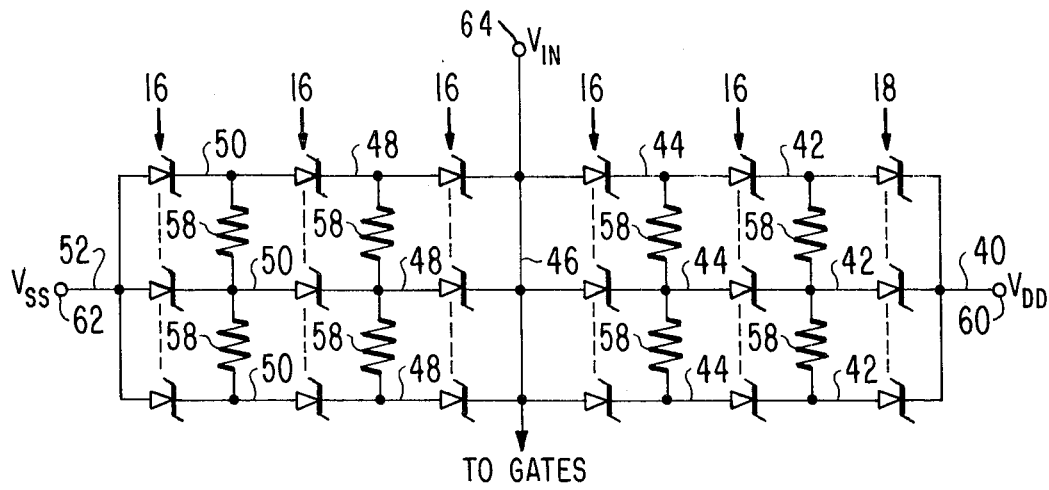
FIG. 3 is a schematic circuit representation substantially equivalent to the rectifier of FIG. 1.

FIG. 3 is a schematic representation of the structure described thus far. Each of the rectifiers 16 and 18 is shown as a separate group of three zener diodes connected by dashed lines. The various metallic conductors 40, 42, 44, 46, 48, 50 and 52 are shown as lines in the relation that they have to the anode and cathode regions of the several rectifiers. The ballasting resistances provided by the material of the several regions 20, 22 and 26 are represented by resistors 58 connected between the various conductors.

The conductor 40 is adapted to be connected to a source of relatively high potential at a terminal 60. This potential is often called $V_{DD}$ in the art. The conductor 52 is adapted to be connected to a source of relatively low potential, known as $V_{SS}$ in the art, at a terminal 62. The conductor 46 is adapted to be connected to a terminal 64 which may be an input terminal of the device and also to other elements on the device 10, such as the gates of insulated gate field effect transistors.

Figure 4:
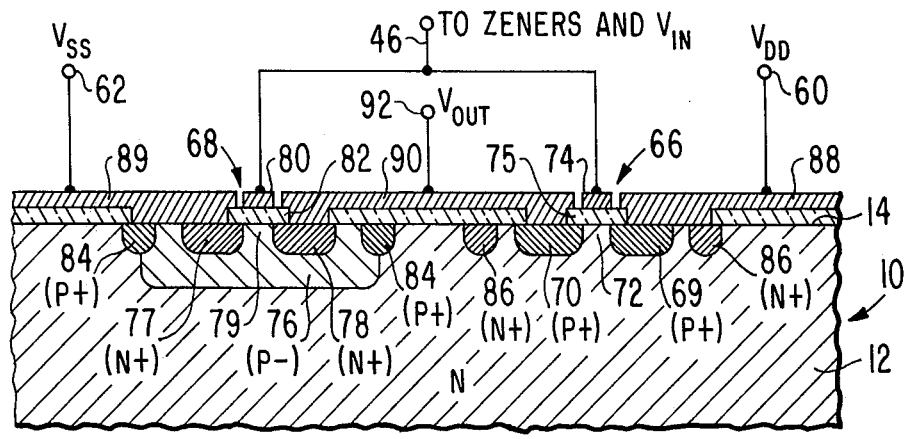
FIG. 4 is a partial cross section of another portion of the integrated circuit device and illustrating the structure of a CMOS pair of elements.

Shown in FIG. 4 is another portion of the device 10 and the body 12 in which are formed a P channel IGFET 66 and an N channel IGFET 68, with which the rectifying elements heretofore described may be used. The P channel IGFET has P+ source and drain regions 69 and 70 with a channel region 72 therebetween. A gate electrode 74 overlies the channel region 72 and is spaced therefrom by a gate insulator 75.

The N channel transistor 68 is formed in a P well 76 in the body 1. The transistor 68 has N+ source and drain regions 77 and 78 respectively which define the ends of a channel region 79. A gate electrode 80 overlies the channel region 79 and is spaced therefrom by a gate insulator 82.

A P+ type guardband 84 may surround the N channel transistor 68 and preferably is located at the edge of the P well 76. An N+ type guardband 86 may surround the P channel transistor 66.

The source 69 of the transistor 66 may be contacted by a conductor 88 adapted to be connected to the $V_{DD}$ terminal 60. The conductor 88 also contacts the guardband 86 and the substrate material of the body 12 as is common practice in the art. Similarly, the source region 77 of the transistor 68 may be contacted by a conductor 89 adapted to be connected to the guardband 84 and the P well 76 and to the $V_{SS}$ terminal 62. The drains 70 and 78 respectively of the transistors 66 and 68, are in the example shown, connected together by means of a conductor 90, which may be connected to an output terminal 92. The gate electrodes 74 and 80 may be connected together and to the conductor 46 so that they are in effect connected to the rectifiers 16 and 18.

In the manufacture of a device 10 having the several regions described above, conventional photolithographic processes may be employed. Of importance is the fact that the depth and doping concentrations in the source and drain regions of the transistors, such as the transistors 66 and 68, are such that when opposite type conductivity regions are brought together PN junction may be defined having reasonable degrees of forward and reverse dynamic resistance, as well as reasonable degrees of breakdown voltage. Consequently, regions 20, 22, 26, and 28 making up the pairs of regions to define the various rectifiers may be formed at the same time, under the same conditions, as those of the regions 69, 70, 77 and 78 which are of corresponding type conductivity so that corresponding regions have the same depth and doping profile. Similarly, the isolating regions 54 may have the same depth and doping profile as the P well 76. Thus, the number of different processing steps needed to make the rectifiers 16 and 18 is compatible with the ordinary processing needed to make the transistors 66 and 68.

In operation, with $V_{SS}$ applied to the terminal 62 and $V_{DD}$ applied to the terminal 60 and no potential applied to the input terminal 64, all of the rectifiers would be reversed biased. With a potential equivalent to $V_{DD}$ on the input terminal 64, the rectifiers 16 between the conductor 46 and the terminal 62 are reverse biased and the rectifiers 16 and 18 are zero biased. In the event that the input voltage goes much higher, the other rectifiers 16 and 18 will be forward biased and thus limit the amount of voltage that can be applied to circuit elements connected to the conductor 46 such as the gates 74 and 80, to a value greater than $V_{DD}$ by the amount of the forward voltage drop through the rectifiers 16 and 18.

With a potential substantially equivalent to $V_{SS}$ on the input terminal 64, the rectifiers 16 and 18 between the conductor 46 and the terminal 60 become reverse biased and the other rectifiers 16 become zero biased. In the event that the input potential goes lower than $V_{SS}$, i.e. in a direction to increase the reverse bias of the rectifiers 16 and 18, the rectifiers 16 between the conductor 46 and the terminal 62 will be forward biased and thus will limit the voltage applied to the gates 75 and 80 to a value more negative than $V_{SS}$ by the amount of the forward voltage drop through the rectifiers 16. The maximum difference between $V_{SS}$ and $V_{DD}$ which can be maintained by the device is limited by the reverse breakdown voltage characteristics of the PN junctions 56. This is so because the junction 56 nearest to the conductor 52 will have the full $V_{SS}-V_{DD}$ voltage across it at all times. The breakdown voltage of each individual rectifier 16 and 18 will be less than this value, and the composite breakdown of the series string will be the sum of the individual breakdown voltages. For the most economic use of space the number of series-connected rectifiers should not exceed the ratio of the $V_{SS}-V_{DD}$ voltage to the individual rectifier breakdown voltage so that the composite breakdown voltage of the rectifiers is less than the breakdown strength of the junctions 56.

Although the reverse bias applied to the rectifiers 16 and 18 is usually not sufficient to cause breakdown of those rectifiers, it is possible for reverse breakdown to occur. For example, if the terminal 60 were not connected to the $V_{DD}$ source but was left floating, the rectifiers 16 and 18 might not be forward biased during a relatively high positive excursion of the potential on the input terminal 64. If the terminal 62 is connected to the source of $V_{SS}$, the rectifiers 16 between the conductor 46 and the terminal 62 will be reverse biased under these conditions and can break down to conduct in the reverse direction. The ballasting action afforded by the multiple metal connections and the intermediate resistances 58 will tend to prevent current hogging during such reverse conduction.

Since the pairs of regions 20 and 22 and 26 and 28 respectfully are formed in side-by-side relation, the depth of the several regions will be determined by the background doping concentration in either the body 12 or the regions 54. The regions will be deeper than would be the case if one were diffused entirely within the other as in the known structures. Consequently, the present device can be fabricated with less danger of contacts spiking through the various regions than could be prior device. Higher yields may therefore be expected.

What is claimed is:
1. In a semiconductor device of the type which has a body of semiconductive material having a surface and at least one zone of one type and degree of conductivity adjacent to said surface, means defining a rectifier in said zone comprising a region of conductivity type opposite to that of said zone in said zone adjacent to said surface,
   a first pair of side-by-side regions of mutually opposite type conductivity in said region of opposite conductivity type and adjacent to said surface, said pair of regions forming a first PN junction,
   separate contacts to each of said side-by-side regions, and
   a second pair of side-by-side regions in said zone adjacent to said surface outside said region of opposite conductivity type and defining a second PN junction.
2. A semiconductor device as defined in claim 1 further comprising means electrically coupling a region of said first pair of side-by-side regions with a region of said second pair of side-by-side regions.
3. A semiconductor device as defined in claim 2 wherein the regions which are coupled by said coupling means are of mutually opposite type conductivity.
4. A semiconductor device as defined in claim 1 wherein said region of opposite type conductivity forms a third PN junction with the material of said zone, the concentration of conductivity modifiers in said region of opposite type conductivity and in said zone and the concentration of conductivity modifiers of the regions of said pairs of side-by-side regions being such that said third PN junction has a substantially higher reverse breakdown strength than the PN junction formed by said pairs of side-by-side regions.

5. A semiconductor device as defined in claim 4 further comprising a conductor connected to a region of one type conductivity in said first pair of side-by-side regions and to a region of opposite type conductivity in said second pair of side-by-side regions whereby the reverse breakdown strength of the series combination of said first and second PN junctions is the sum of their individual reverse breakdown strengths, said sum being less than the breakdown strength of said third PN junction.

6. A semiconductor device as claimed in claim 5 wherein there are a plurality of separate conductors connected to said region of one type conductivity in said first pair of side-by-side region and to said region of opposite conductivity in said second pair of side-by-side regions.

7. A semiconductor device as defined in claim 1 further comprising a plurality of regions in said zone adjacent to said surface for defining a pair of insulated gate field effect transistors, one of which has source and drain regions of conductivity type opposite to that of said zone in said zone adjacent to said surface and the other having a well region of conductivity type opposite to that of said zone in said zone adjacent to said surface and source and drain regions of said one type conductivity within said well region, said side-by-side regions forming said first and second PN junctions having the same doping profiles as the source and drain regions of corresponding conductivity type, said region surrounding said one of said pairs of side-by-side regions having the same doping profile as said well region.

* * * * *